United States Patent [19]

Egawa et al.

[11] Patent Number: 4,720,742
[45] Date of Patent: Jan. 19, 1988

[54] SEMICONDUCTOR DEVICE CARRIER

[75] Inventors: Yoshinori Egawa, Hachiohji; Ryuichi Nakamura, Kawasaki, both of Japan

[73] Assignee: Yamaichi Electric Mfg. Co., Ltd., Tokyo, Japan

[21] Appl. No.: 844,014

[22] Filed: Mar. 26, 1986

[30] Foreign Application Priority Data

Mar. 26, 1985 [JP] Japan .............. 60-43542[U]

[51] Int. Cl.⁴ .......................................... H01L 23/42
[52] U.S. Cl. ...................................... 357/79; 357/81; 174/52 R
[58] Field of Search ................... 357/79, 81; 165/80.4; 174/52 R, 52 H, 52 FP

[56] References Cited

U.S. PATENT DOCUMENTS 3,548,927 12/1970 Spurling ................................ 357/81
3,652,974 3/1972 Tems .
3,893,161 7/1975 Pesak .................................... 357/81
4,203,488 5/1980 Johnson ................................ 357/81
4,215,361 7/1980 McCarthy ............................. 357/68
4,509,839 4/1985 Lavochkin ............................ 357/79

FOREIGN PATENT DOCUMENTS 53-19742 5/1978 Japan .

Primary Examiner—Andrew J. James
Assistant Examiner—Mark Prenty
Attorney, Agent, or Firm—Wenderoth, Lind & Ponack

[57] ABSTRACT

A semiconductor device carrier includes a carrier substrate having an open section in which a semiconductor device is accommodated, and a retaining member slidably coupled to the carrier substrate which linearly recriprocates on a surface of the carrier substrate having the open section and which is provided with a retaining element adapted to retain the semiconductor device accommodated within the open section of the carrier substrate when the retaining member has moved in one direction and to release the retention of the semiconductor device when the retaining member has moved in the other direction.

5 Claims, 11 Drawing Figures

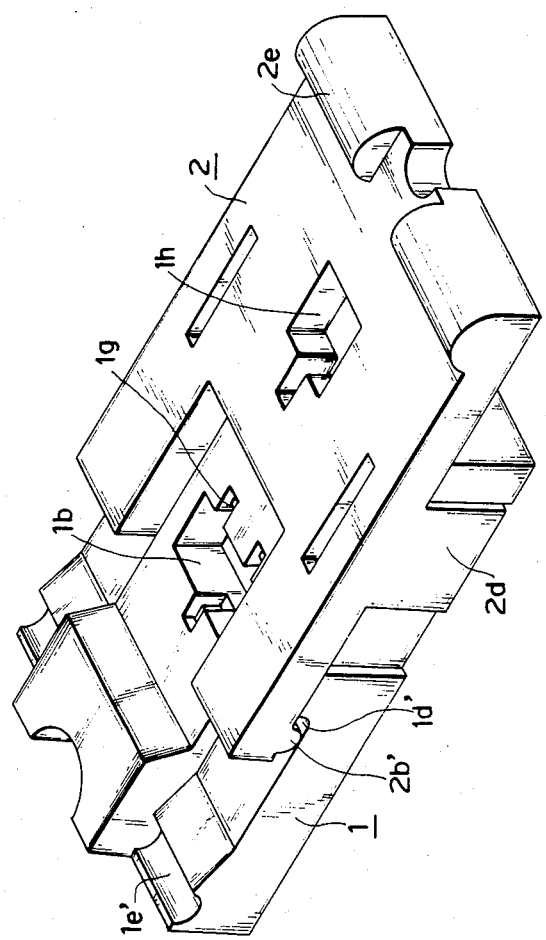

SEMICONDUCTOR DEVICE CARRIER

BACKGROUND OF THE INVENTION

1. Field of the Invention

The present invention relates to a carrier for a semiconductor device, such as a transistor, an IC package, etc., which is adapted to support the semiconductor device thereon and is used for setting the semiconductor device in place relative to a socket.

2. Description of the Related Art

There have heretofore been proposed various carriers of this type such as those disclosed in U.S. Pat. No. 3,652,974 and Japanese Utility Model Publication No. 53-19742, for example. In the related art references, since a pair of catch claws are integrally formed with a carrier body at the peripheral portions of a semiconductor device accommodating section thereof so as to be capable of engaging with the edges of a semiconductor device, the catch claws are limited in size, are inferior in reliability with respect to retaining the semiconductor device with exactitude and are liable to wear off or break down when semiconductor device is attached to and detached from the accommodating section of the carrier body. This results in the accidental release of the semiconductor device from the carrier.

OBJECT AND SUMMARY OF THE INVENTION

The present invention has been accomplished in view of the drawbacks suffered by the related art. The main object of the present invention is to provide a semiconductor device carrier that is easy to handle, is capable of reliably retaining a semiconductor device with exactitude and that eliminates the conventional drawbacks.

To attain the object described above, according to the present invention, there is provided a semiconductor device carrier comprising a carrier substrate having an open section formed therein for accommodating therein a semiconductor device, and a retaining member slidably coupled to the carrier substrate so as to linearly reciprocate on a surface of the carrier substrate having the open section. The retaining member is provided with means adapted to retain the semiconductor device when the retaining member has moved in one direction and to release the semiconductor device when the retaining member has moved in the other direction.

The above and other objects, characteristic features and advantages of the present invention will become more apparent to those skilled in the art as the disclosure is made in the following description of preferred embodiments of the invention, as illustrated in the accompanying drawings.

BRIEF DESCRIPTION OF THE DRAWINGS

FIG. 7 is a perspective view illustrating another embodiment of the semiconductor device carrier according to the present invention.

DESCRIPTION OF THE PREFERRED EMBODIMENTS

The present invention will now be described in detail with reference to the illustrated embodiments.

Figure 1:
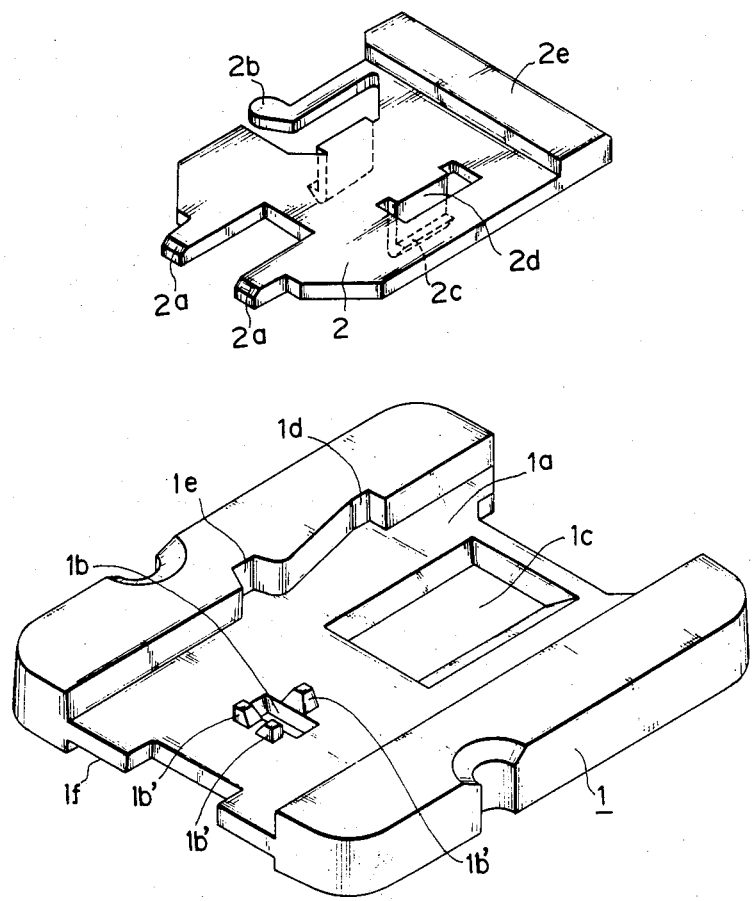
FIG. 1 is an exploded perspective view illustrating one embodiment of the semiconductor device carrier according to the present invention.
Figure 2A:
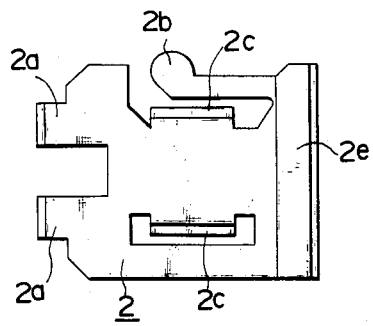
FIG. 2A is a plan view showing a retaining member as one of two components constituting the embodiment of FIG. 1.
Figure 2B:
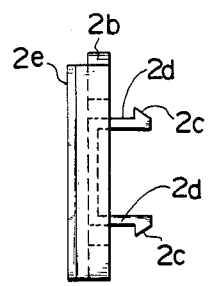
FIG. 2B is a rear view of the retaining member.
Figure 2C:
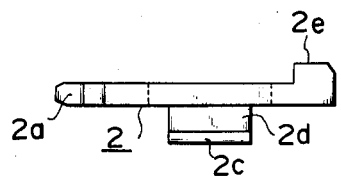
FIG. 2C is a side view of the retaining member.
Figure 3A:
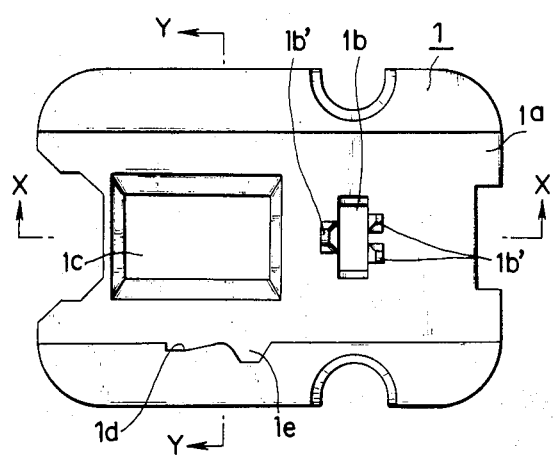
FIG. 3A is a plan view showing a carrier substrate as the other component constituting the embodiment of FIG. 1.
Figure 3C:
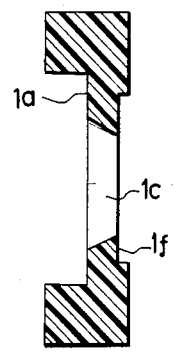
FIG. 3C is a cross-sectional view taken along line Y—Y in FIG. 3A.
Figure 3B:
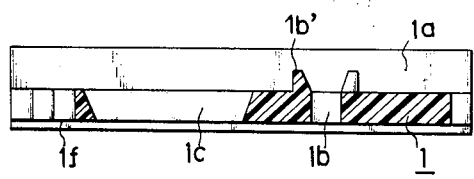
FIG. 3B is a cross-sectional view taken along line X—X in FIG. 3A.

FIG. 1 through FIG. 6 illustrate one embodiment of the semiconductor device carrier according to the present invention. The carrier comprises a carrier substrate 1 and a slidable retaining member 2. As illustrated in FIGS. 1 and 3, the carrier substrate 1 has a guide 1a formed for accommodating the retaining member 2 therein and allowing the retaining member 2 to slide thereon. The guide groove 1a of the carrier substrate 1 has an open section 1b and a window section 1c formed in the bottom thereof respectively for accommodating therein a semiconductor device 3 and for mounting therein the retaining member 2. Around the upper edge of the open section 1b formed in the bottom of the guide groove 1a there are a plurality of projections 1b' for positioning terminals 3a of the semiconductor device 3. On one of opposite side walls of the guide groove 1a there are first and second engaging sections 1d and 1e. The reciprocation of the retaining member 2 is limited by the engaging sections. The carrier substrate 1 has on the bottom surface thereof a concave groove 1f extending in the same direction as the guide groove 1a formed on the upper surface of the carrier substrate 1.

The slidable retaining member 2 has a pair of retaining pieces 2a, a latch arm 2b, a pair of connecting pieces 2d having engaging claws 2c, and a slide operation section 2e as illustrated in FIGS. 1 and 2A–2C. The retaining pieces 2a project forward and retain, at their respective lower surfaces, the upper surface of the opposite side edges of the semiconductor device 3 accommodated within the open section 1b of the carrier substrate 1. The latch arm 2b is formed on one side of the retaining member 2 and is adapted to resiliently contact and slide on the side wall of the guide groove 1a and engage with the first and second engaging sections 1d and 1e of the carrier substrate 1 by its resilient restoring force, thereby locking the retaining member 2 to the carrier substrate 1. The connecting pieces 2d having the engaging claws 2c project vertically from the lower surface of the retaining member 2 and are adapted to be inserted into the window section 1c of the carrier substrate 1 with the outside surfaces thereof in sliding contact with the opposite walls of the window section 1c and with the engaging claws 2c engaged with the opposite edges of the window section 1c, thereby coupling the retaining member 2 to the carrier substrate 1 so that the retaining member 2 is slidable in the guide groove 1a. The slide operation section 2e provided rewardly on the retaining member, projects upwardly and facilitates the linear sliding reciprocation of the retaining member 2.

Figure 6:
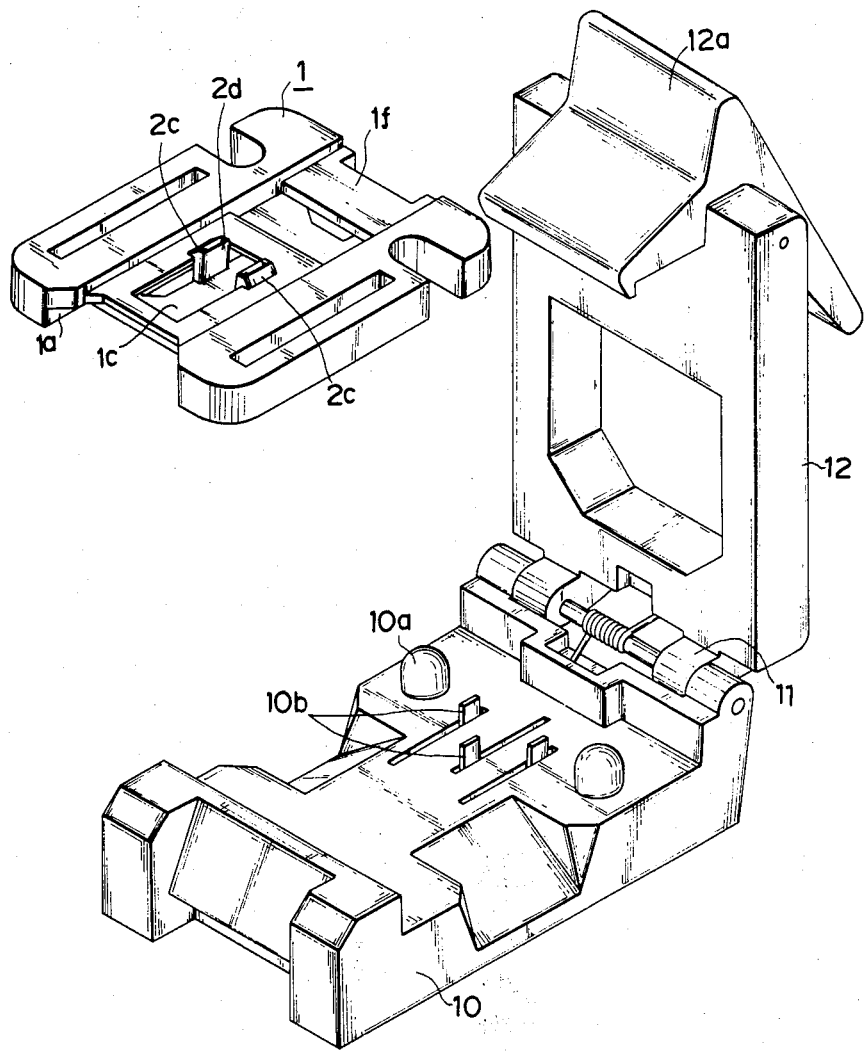
FIG. 6 is a perspective view illustrating the semiconductor device carrier of FIG. 1 prior to the setting thereof relative to a socket.

To be specific, the retaining member 2 is snugly fitted in the guide groove 1a of the carrier substrate 1 by bringing the latch arm 2b provided on one side of the retaining member into resilient contact with the side wall of the guide groove 1a and by simultaneously bringing the opposite side of the retaining member into contact with the opposite side wall of the guide groove due to the force of the latch arm being urged by the side wall of the guide groove and, at the same time, by inserting the connecting pieces 2d into the window section 1c so that the outside surfaces of the connecting pieces are brought into sliding contact with the side walls of the window section and that the engaging claws 2c are brought into engagement with the open edges of the window section on the bottom surface side of the carrier substrate 1 as shown in FIG. 6. The retaining member 2 thus fitted snugly in the guide groove 1a of the carrier substrate 1 is difficult to detach from the carrier substrate, but is capable of reciprocating in the guide groove 1a in directions toward and away from the open section 1b for accommodating the semiconductor device 3 therein with the bottom and side walls of the guide groove 1c and the side walls of the window section 1c as guide means.

Figure 4:
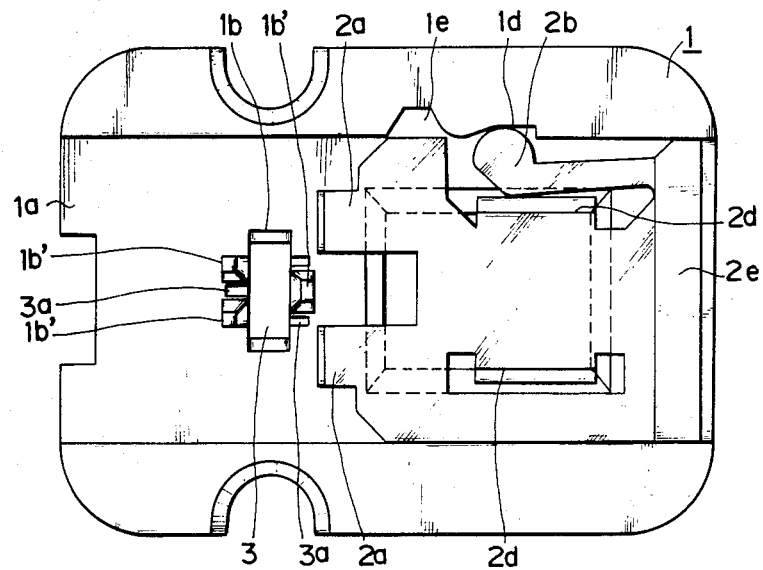
FIG. 4 is a plan view illustrating the retaining member coupled to the carrier substrate and disposed at a position at which a semiconductor device has been released from the retaining member.
Figure 5:
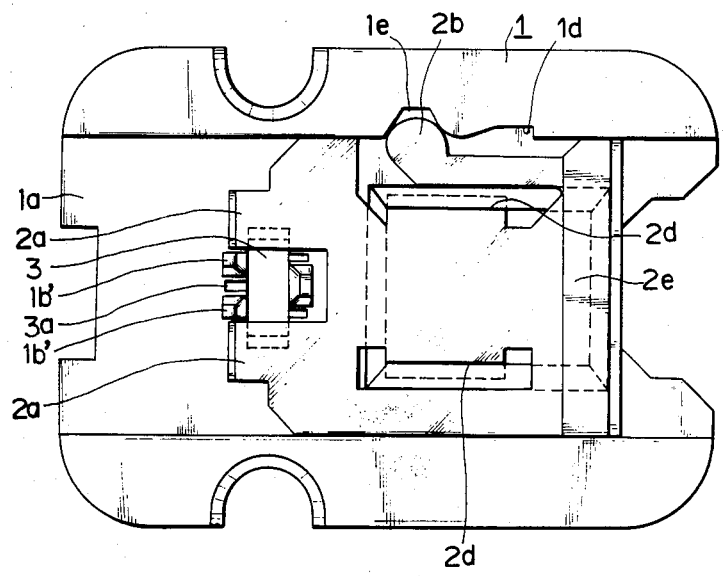
FIG. 5 is a plan view illustrating the retaining member coupled to the carrier substrate and disposed at a position at which the semiconductor device has been retained by the retaining member.

When the retaining member 2 is held in a retracting position at which the latch arm 2b is engaged with the first engaging section 1d of the carrier substrate 1 by its resilient force, as illustrated in FIG. 4, the semiconductor device 3 such as a transistor is free from any load when accommodated within the open section 1b of the carrier substrate 1. At this time, the terminals 3a of the semiconductor device 3 are disposed on the opposite sides of and/or between the positioning projections 1b'. Then, the retaining member 2 is slid in the guide groove 1a to advance toward the open section 1b by operating the slide operation section 2e. As a result, the retaining pieces 2a slide onto the upper surface on the opposite side edges of the semiconductor device 3 and the latch arm 2b is engaged with the second engaging section 1e as illustrated in FIG. 5. Thus, the retaining pieces 2a of the retaining member can retain the semiconductor device 3 on the lower surfaces thereof and the retaining member 2 is locked to the carrier substrate 1 by the engagement of the latch arm 2b with the second engaging section 1e. Therefore, the semiconductor device 3 can be reliably supported with exactitude between the retaining member 2 and the carrier substrate 1.

FIG. 6 illustrates a socket adapted to set thereon the semiconductor device carrier shown as one embodiment of the present invention in FIG. 1 through FIG. 5. The socket comprises a socket body 10, and a press plate 12 pivotally attached to the socket body 10 by means of a hinge mechanism 11. The socket body 10 is provided with positioning protuberances 10a for setting the position of the semiconductor device carrier and with contacts 10b which are brought into contact with the terminals 3a of the semiconductor device 3 accommodated within the open section 1b of the carrier substrate 1. The press plate 12 of the socket is provided with a lock lever 12a pivotally attached to the free end thereof for locking the press plate 12 in a closed state relative to the socket body. The semiconductor device carrier having the semiconductor device 3 supported thereon is set in position relative to the socket body 10 so that the terminals 3a of the semiconductor device 3 are kept in contact with the contacts 10b of the socket body 10. The press plate 12 is then closed and locked to the socket body 10 by the use of the lock lever 12a to press the semiconductor device carrier down. As a result, the terminals 3a of the semiconductor device 3 come into pressure contact with the contacts 10b. In this state, the socket is used for the purpose of measuring characteristics of the semiconductor device, for example. After the measurement, the lock lever 12a is unlocked, the press plate 12 is raised and the semiconductor device carrier is taken out of the socket. The socket is then ready for subsequent measurement.

FIG. 7 illustrates another embodiment of the semiconductor device carrier according to the present invention. In this embodiment, a retaining member 2 is superposed on a carrier substrate 1 so as to slidably reciprocate with the opposite lateral walls of the carrier substrate 1 as guide means and is coupled to the carrier substrate by a pair of connecting pieces 2d extending downwardly from the opposite lateral walls of the retaining member 2 which are retained against the opposite lateral walls of the carrier substrate 1. The carrier substrate 1 is provided on the upper surface thereof with a first stopper section 1d' and a second stopper section 1e' which limit therebetween the amount of sliding reciprocation of the retaining member 2. The retaining member 2 is provided on the lower surface thereof facing the carrier substrate 1 with a latch element 2b' which is stopped in the first stopper section 1d' when the retaining member 2 is retracted to the fullest extent of its sliding reciprocation to release retention of a semiconductor device and which is engaged with the second stopper section 1e' when the retaining member 2 is advanced to the fullest extent of its sliding reciprocation to reliably retain the semiconductor device with exactitude. Furthermore, in this embodiment, the carrier substrate 1 has an open section 1b for accommodating therein a semiconductor device and also has a plurality of grooves 1g formed along the edge of the open section 1b so as to communicate with the open section 1b, in place of the plurality of projections 1b' formed around the open section 1b in the first embodiment, for positioning the terminals of the semiconductor device. On the other hand, the retaining member 2 has a contact receiving hole 1h formed therein which matches the open section 1b when the semiconductor device accommodated within the open section 1b has been retained by the retaining member 2, thereby permitting the terminals of the semiconductor device to come into contact with the contacts provided in the socket. Thus, the semiconductor device can be supported between the carrier substrate 1 and the retaining member 2 by advancing the retaining member on the carrier substrate and can be attached to and detached from the open section 1b free from any load by retracting the retaining member to open the open section, similarly to the first embodiment. Furthermore, similarly to the first embodiment, this embodiment is provided with latch means which can retain the retaining member at a position at which the retaining member has been advanced to and release the semiconductor device at a position at which the retaining member has been retracted to, respectively.

According to the present invention, as described above, it is possible to provide a semiconductor device carrier that is capable of easily supporting between the carrier substrate and the retaining member, with exactitude, a semiconductor device within the open section free from any load, that retains the semiconductor device by causing the retaining member to be advanced and slid on the carrier substrate to slide over the semiconductor device and that is also capable of enjoying a long service life because the present invention eliminates use of the conventionally used catch claws which have been subjected to adverse influences due to repeated attachment and detachment of semiconductor devices and have consequently been worn off or broken down.

Furthermore, according to the present invention, since the retention and release of a semiconductor device can be attained by utilization of planar slide of the retaining member coupled to the carrier substrate, the thickness of the carrier as a whole can be made smaller. By retracting the retaining member to its retention release position, a semiconductor device can easily be attached to or detached from the open section of the carrier substrate free from load and without interfering with the retaining member.

What is claimed is:

1. An apparatus for carrying a semiconductor device, said apparatus comprising:
    a carrier substrate having a generally planar upper surface, said carrier substrate having an open section extending therein that is open at said upper surface, the semiconductor device being disposed in the open section when carried by the apparatus; and
    a retaining member slidably mounted on said carrier substrate for moving relative to said carrier substrate along a linear path between first and second positions, said path extending substantially parallel to said upper surface, said retaining member having a retaining section facing said upper surface and which is slidable relative to and over said upper surface toward and away from said open section when the retaining member is moved along said path between said first and said second positions, the retaining section being positioned over the semiconductor device for retaining the semiconductor device in the open section after said retaining member is moved to said first position along said linear path and for releasing the semiconductor device when said retaining member is moved to said second position along said linear path.

2. The apparatus as claimed in claim 1, wherein said retaining member comprises a latch means for engaging said carrier substrate when said retaining member is moved to said second position to releasably fix the retaining member at said second position.

3. The apparatus as claimed in claim 1, wherein said carrier substrate has a guide groove extending therein in a direction that is parallel to said path, and said retaining member extends in said guide groove and is guided therein along said linear path when moved between said first and said second positions.

4. The apparatus as claimed in claim 3, wherein said carrier substrate has a window section extending therein that is open to said upper surface, the upper surface defines the bottom of said guide groove, and said retaining member has a pair of connecting pieces extending through said window section and slidably engaging said carrier substrate at respective edges defining said window section, said connecting pieces sliding along said edges respectively when said carrier substrate is moved between said first and said second positions.

5. The apparatus as claimed in claim 3, wherein said guide groove is defined between opposite side walls, one of said opposite said walls having an engaging section, and said retaining member comprises a resilient latch arm extending into said guide groove and engaging said one of said sidewalls, said resilient latch arm being biased to engage said engaging section when said retaining member is moved to said second position for releasably fixing said retaining member in said second position.

* * * * *